United States Patent
Agata et al.

[11] Patent Number: 5,426,601
[45] Date of Patent: Jun. 20, 1995

[54] SEMICONDUCTOR MEMORY DEVICE HAVING A PROLONGED DATA HOLDING TIME

[75] Inventors: Masashi Agata; Hironori Akamatsu; Hirohito Kikukawa; Akihiro Sawada; Shunichi Iwanari, all of Osaka, Japan

[73] Assignee: Matsushita Electric Industrial Co., Ltd., Osaka, Japan

[21] Appl. No.: 184,933

[22] Filed: Jan. 24, 1994

[30] Foreign Application Priority Data

Jan. 27, 1993 [JP] Japan .................. 5-011401

[51] Int. Cl.⁶ .............................. G11C 5/14
[52] U.S. Cl. .................. 365/226; 365/228; 365/229
[58] Field of Search ......... 365/189.09, 189.11, 365/226, 227, 228, 229; 307/296.01, 296.02

[56] References Cited

U.S. PATENT DOCUMENTS 4,977,537 12/1990 Dias et al. ............. 365/229
5,321,653 6/1994 Suh et al. ............ 365/189.09

FOREIGN PATENT DOCUMENTS 58-23386 2/1983 Japan .
58-23387 2/1983 Japan .
 5-21742 1/1993 Japan .

OTHER PUBLICATIONS

M. Aoki et al., "A 1.5V DRAM for Battery-Based Applications", 1989 IEEE International Solid-State Circuits Conference, pp. 238-240 (Feb. 17, 1989).

Primary Examiner—Joseph A. Popek
Assistant Examiner—Vu Le
Attorney, Agent, or Firm—Willian Brinks Hofer Gilson & Lione

[57] ABSTRACT

An external power supply voltage $V_{CC}$ is applied to a peripheral circuit as a first internal power supply voltage $V_{PERI}$. A power supply voltage control circuit outputs a voltage control signal $V_{SIG}$ of a high logic level if $V_{CC}$ is not greater than a low limit voltage $V_{OL}$ in a voltage range specified by VCC recommended operating conditions, otherwise it outputs $V_{SIG}$ of a low logic level. A power supply circuit applies a second internal power supply voltage $V_W$ and a third internal power supply voltage $V_{WORD}$ to a memory cell section. $V_W$ is equal to $V_{PERI}$ if $V_{SIG}$ is HIGH, while on the other hand $V_W$ is a voltage as a result of boosting $V_{PERI}$. $V_{WORD}$ is a voltage as a result of boosting $V_W$ to a further extent. A row decoder sends out $V_W$ onto an enable signal line of a row of sense amplifiers, and $V_{WORD}$ onto a word line of a memory cell array so that $V_W$ becomes a high-logic-level data write voltage to a memory cell. This adequately prolongs the data-holding time with no sacrifice in memory cell voltage resistance.

17 Claims, 10 Drawing Sheets

F I G.1
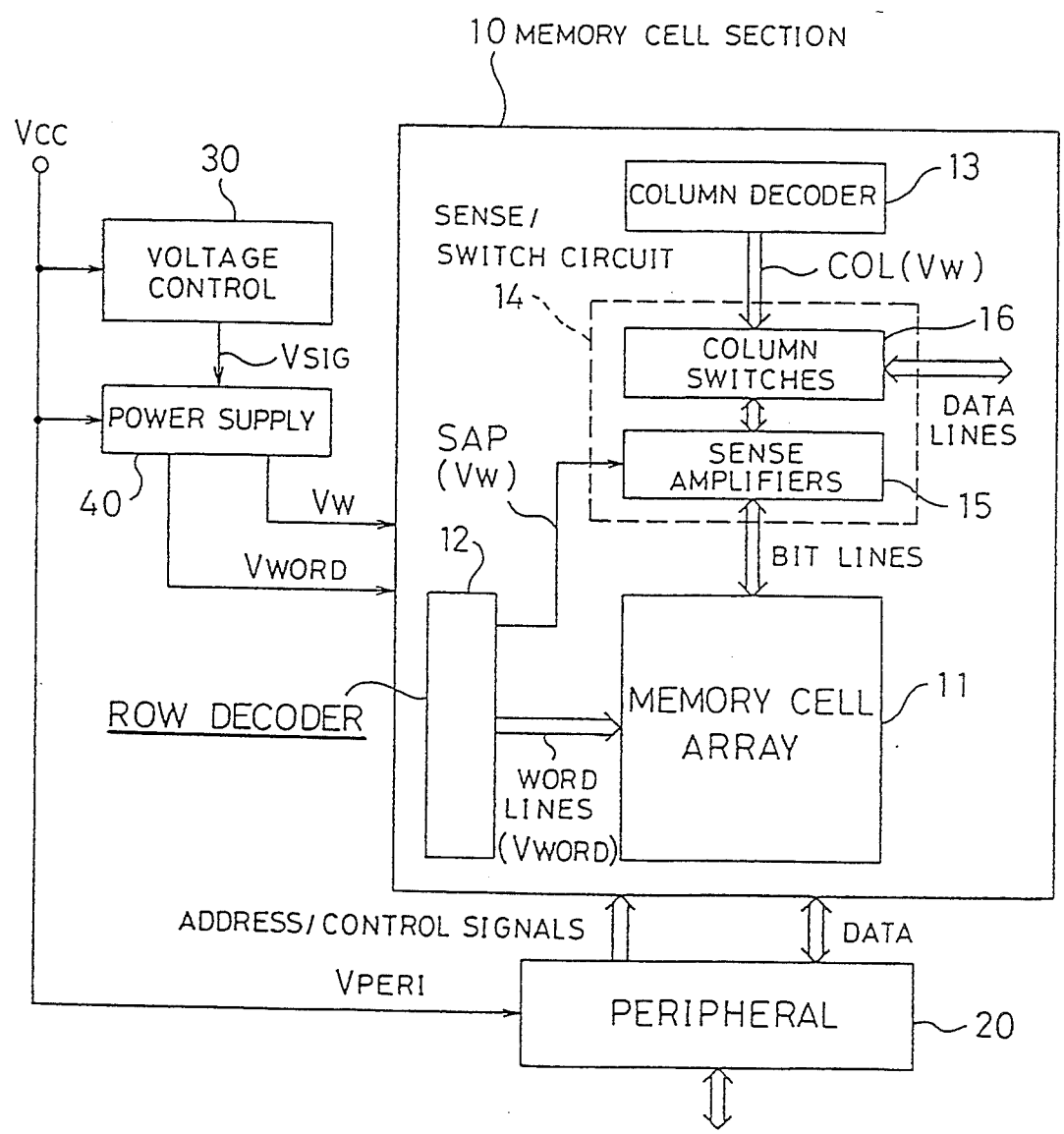

SEMICONDUCTOR MEMORY DEVICE HAVING A PROLONGED DATA HOLDING TIME

TECHNICAL FIELD OF THE INVENTION

The present invention pertains to semiconductor memories of a charge storage type such as dynamic random-access memories (DRAMs).

BACKGROUND OF THE INVENTION

In a DRAM, memory cells store data in terms of electric charge. The stored charge, however, fades with time due to a leakage of current. Therefore, periodic "refresh" operations must be carried out to maintain the stored data.

If data of a high logic level is written in a DRAM cell using a low voltage, this means that the amount of the stored electric charge in a capacitor is small. Therefore, the data-holding time is limited. If the data-holding time gets too short, refreshing cannot prevent the stored data from vanishing.

5 V DRAMs of a single power source type are known from Japanese Patent Applications, published under No. 58-23386and No. 58-23387. In these prior art techniques, 6 V or 7 V, which is greater than an external power supply voltage $V_{CC}(=5\text{ V})$, is used to write data into a memory cell. This prevents loss of data even if some drop in $V_{CC}$ occurs, thereby improving operational margins.

Another type of DRAM is disclosed by M. Aoki et al ("A 1.5 V DRAM for Battery-Based Applications", ISSCC DIGEST OF TECHNICAL PAPERS, pp.238–239, February, 1989) as well as by Japanese Patent Application, published under No. 5-21742. These prior art techniques use a cell plate voltage variation method. More specifically, the voltage of cell plates is made to vary so as to effectively boost a write voltage used to write data in a memory cell.

The above-described techniques, however, present drawbacks. In the former techniques, a high write voltage, such as 6 V or 7 V, is used. This causes the memory cell to suffer from a problem of how to resist such a high voltage, resulting in reducing DRAM life. In the latter techniques, the cell plate approach is adopted which, however, is not practical. The reason is that the capacitance of cell plates is so great that their voltage cannot be changed at high speeds.

SUMMARY OF THE INVENTION

It is a main object of the present invention to provide an improved semiconductor memory capable of prolonging the data-holding time with no sacrifice in memory cell voltage resistance.

The present invention achieves the object in the following way. An internal power supply voltage that varies with an external power supply voltage is compared with a predetermined voltage for the choice of which voltage to use as a voltage for data of a high logic level being written in a memory cell. This comparison operation is explained more specifically. If the internal power supply voltage is greater than the predetermined voltage, then the former is selected as a HIGH data write voltage (hereinafter called the "HIGH data write voltage"). If the internal power supply voltage is lower than the predetermined voltage, then a voltage (>the internal power supply voltage) is selected.

The present invention discloses an improved semiconductor memory comprising a power supply circuit, a memory cell circuit, a sense amplifier, and a row decoder. A first internal power supply voltage $V_{PERI}$ that varies with an external power supply voltage $V_{CC}$ is applied to the power supply circuit. The power supply circuit outputs two different voltages; a second internal power supply voltage $V_W$ that is set at the same value as $V_{PERI}$ if $V_{PERI}>$ the predetermined voltage or above $V_{PERI}$ if $V_{PERI}<$ the predetermined; and a third internal power supply voltage $V_{WORD}$ that is set above $V_W$. $V_{PERI}$ may take the same voltage value as $V_{CC}$ or be a voltage $V_{RD}$ as a result of decreasing $V_{CC}$. The memory cell circuit comprises a capacitor for holding electric charges and a MOS transistor whose source, drain, and gate are respectively connected with a bit line, with the aforesaid capacitor, and with a word line. The sense amplifier has a MOS transistor whose source and drain are respectively connected with a sense enable signal line and with the bit line and whose gate is fed a signal for making the MOS transistor of the aforesaid sense amplifier conduct. The row decoder places $V_W$ and $V_{WORD}$, output from the power supply circuit, onto the sense enable signal line and onto the word line, respectively.

For high-speed read and write operations to be realized, $V_W$ is applied from the power supply circuit to a gate of a MOS transistor forming a column switch circuit.

For the case of semiconductor memories including a shared switch circuit as a part of its organization, $V_{WORD}$ is applied to a gate of a MOS transistor forming the shared switch circuit from the power supply circuit, like the MOS transistor of the aforesaid memory cell.

The present invention has several advantages. If $V_{CC}$ (or $V_{RD}$) is adequately high, then that $V_{CC}$ (or $V_{RD}$) acts as a voltage for data of a high logic level being written in a memory cell. Therefore, there is no need to take into account the aforesaid problem of how to resist a high voltage being applied to a memory cell. If $V_{CC}$ or $V_{RD}$ is low, it is possible to prolong the data-holding time by raising the write voltage used to write data of a high logic level.

The sense amplifier determines the write voltage. In other words, $V_W$, applied to a source of a MOS transistor of the sense amplifier, is applied to a capacitor of a memory cell through a bit line and a MOS transistor of the memory cell. The capacitor stores electric charge by a proportional amount to $V_W$ applied. At this point, $V_{WORD}$ is applied to a gate of the MOS transistor of the memory cell circuit through a word line, assuring complete conduction of the MOS transistor of the memory cell circuit.

BRIEF DESCRIPTION OF THE DRAWINGS

FIG. 1 is a block diagram showing a semiconductor memory according to a preferred embodiment of the present invention.

DETAILED DESCRIPTION OF THE INVENTION

Figure 2:
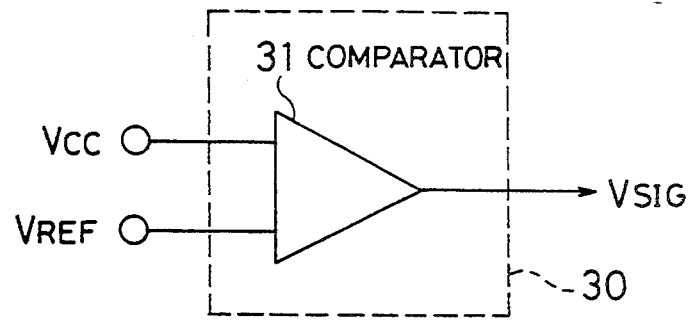
FIG. 2 is a circuit diagram showing a power supply voltage control circuit of FIG. 1.

Preferred embodiments are described below with the help of the accompanying drawings.

Embodiment 1

FIG. 1 shows the organization of a DRAM according to a first preferred embodiment of the present invention. This DRAM comprises a memory cell section 10, a peripheral circuit 20, a power supply voltage (PSV) control circuit 30, and a power supply circuit 40. The memory cell section 10 includes a memory cell array 11, a row decoder 12, a column decoder 13, and a row of sense/switch circuits 14. The row 14 has a row of sense amplifiers 15 and a row of column switch circuits 16.

$V_{CC}$ is directly applied to the peripheral circuit 20 as $V_{PERI}$. The circuit 20 not only applies an address and a control signal to the memory cell section 10 but also controls data transfer between the memory cell section 10 and the outside of the DRAM. The selection of which memory cell to access is done by the row decoder 12 as well as by the column decoder 13 on the basis of the address received from the peripheral circuit 20. Like the peripheral circuit 20, the PSV control circuit 30 and the power supply circuit 40 are fed $V_{CC}$.

The PSV circuit 30 contains a comparator 31 (see FIG. 2). The comparator 31 makes a comparison between $V_{CC}$ and a reference voltage $V_{REF}$. If $V_{CC} < V_{REF}$, then the comparator 31 sends out a signal of a high logic level as a voltage control signal $V_{SIG}$. If $V_{CC} > V_{REF}$, the comparator 31 this time sends out a signal of a low logic level as $V_{SIG}$.

Figure 3:
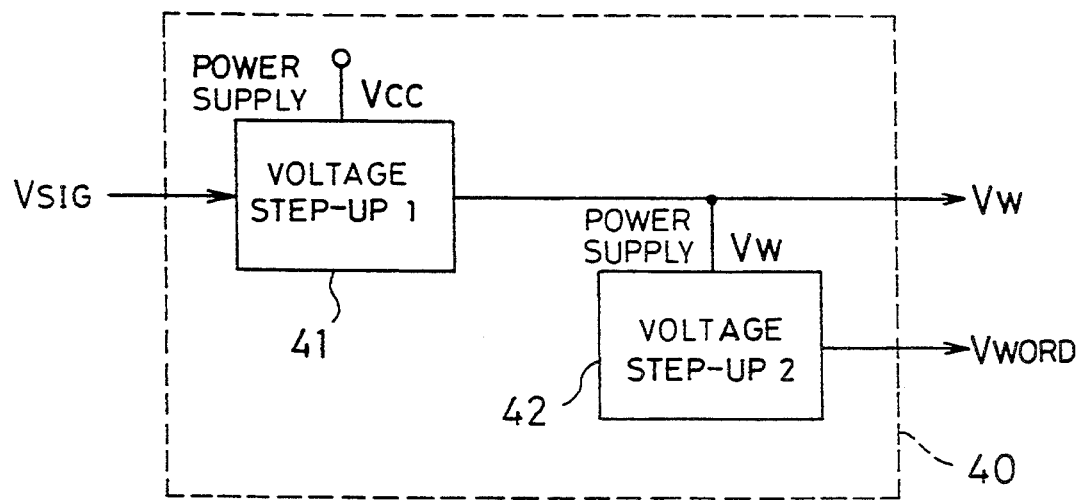
FIG. 3 is a block diagram showing a power supply circuit of FIG. 1.

As shown in FIG. 3, the power supply circuit 40 has a first voltage step-up circuit 41 and a second voltage step-up circuit 42. If $V_{SIG}$ from the PSV control circuit 30 is LOW, the first voltage step-up circuit 41 outputs a voltage equal to $V_{CC}$ as $V_W$, whereas if $V_{SIG}$ is HIGH, the circuit 41 outputs a voltage as a result of boosting $V_{CC}$ as $V_W$. The second voltage step-up circuit 42 outputs a voltage as a result of further boosting $V_W$ output from the circuit 41, as $V_{WORD}$. These $V_W$ and $V_{WORD}$ are applied to the memory cell section 10.

Figure 4:
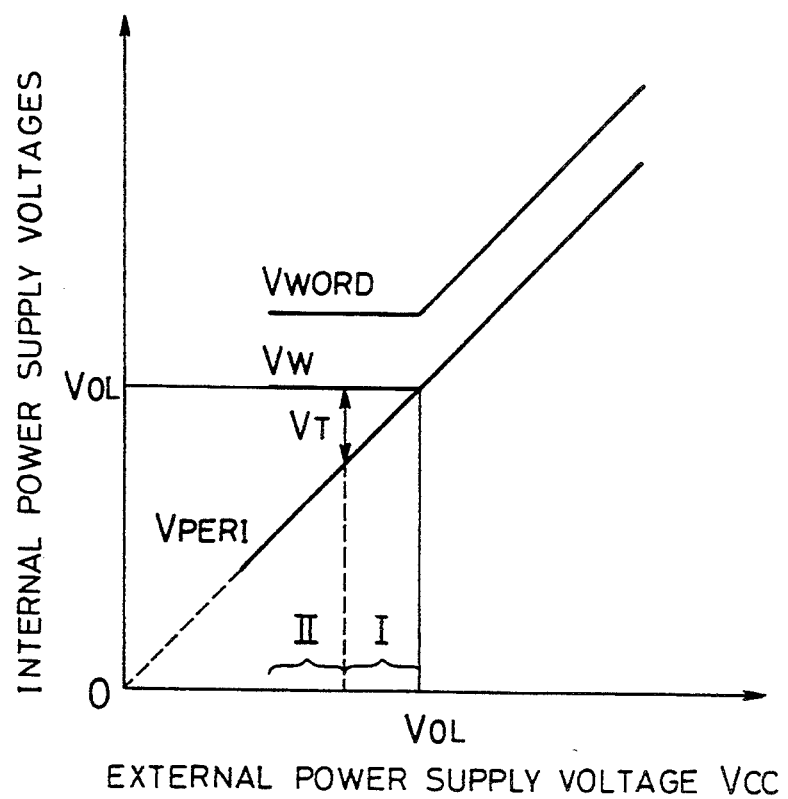
FIG. 4 shows an external power supply voltage-internal power supply voltage relationship, at the time when the power supply circuit of FIG. 3 is used in the semiconductor memory of FIG. 1.

FIG. 4 shows a relationship between the internal power supply voltage ($V_{CC}$) and the external power supply voltage ($V_{PERI}$, $V_W$, $V_{WORD}$) for the power supply circuit 40 of FIG. 3.

In usual DRAMs, $V_{CC}$ recommended operating conditions are set, the contents of which are a standard voltage $V_0$, a high limit voltage $V_{0H}$, and a low limit voltage $V_{0L}$. For example, for 5 V DRAMs of a single power source type, $V_0 = 5.0$ V, $V_{0H} = 5.5$ V, and $V_{0L} = 4.5$ V. On the other hand, for 3.3 V DRAMs of a single power source type, $V_0 = 3.3$ V, $V_{0H} = 3.6$ V, and $V_{0L} = 3.0$ V.

FIG. 4 shows characteristics in a case where $V_{REF}$ is set at $V_{0L}$ that is a low limit voltage in the voltage range specified by the $V_{CC}$ recommended operating conditions (for example, 4.5 V or 3.0 V). As shown in the figure, $V_{PERI}$ monotonically varies with $V_{CC}$ over the full range of $V_{CC}$. $V_W$ agrees with $V_{PERI}$ if $V_{CC}$ is greater than $V_{0L}$. $V_W$ has a constant voltage value (i.e., $V_{0L}$) if $V_{CC}$ is lower than $V_{0L}$. $V_{WORD}$ is greater than $V_W$ over the full range of $V_{CC}$. The difference between $V_W$ and $V_{WORD}$ is set above a threshold voltage $V_T$ of one MOS transistor.

FIG. 4 shows $V_{CC}$ regions I and II. In the region I, the difference between $V_{PERI}$ and $V_W$ is not greater than $V_T$ so that the memory cell section 10 can be connected directly to the peripheral circuit 20 as shown in FIG. 1. On the other hand, in the region II, the difference between $V_{PERI}$ and $V_W$ is greater than $V_T$ so that a level shift circuit is sandwiched between the memory cell section 10 and the peripheral circuit 20 to make it (the level shift circuit) act as a voltage interface.

Figure 5:
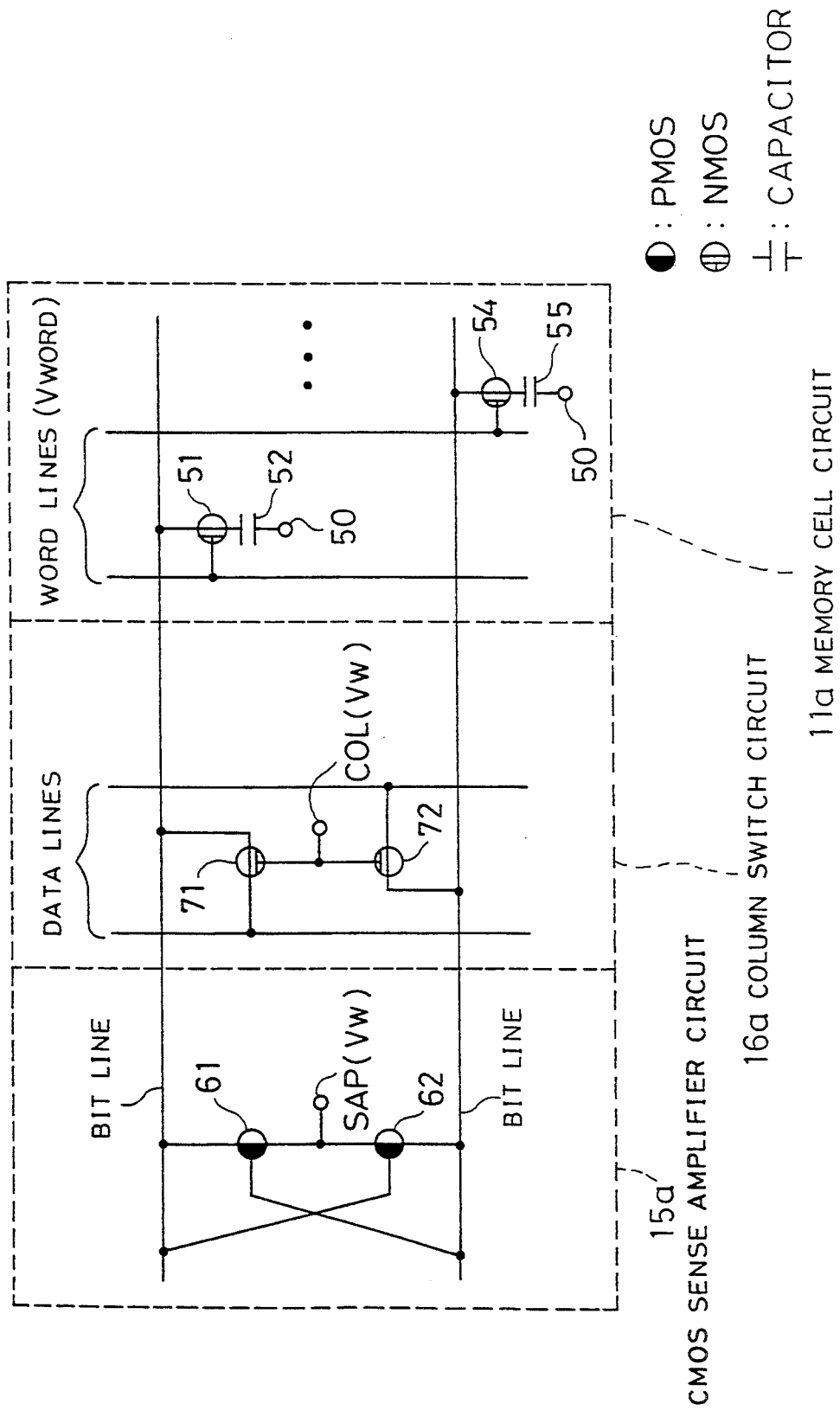
FIG. 5 is a circuit diagram showing in detail a memory cell section of FIG. 1.

Referring now to FIG. 5, the organization of the memory cell section 10 is explained in detail. FIG. 5 shows a memory cell circuit 11a, a CMOS sense amplifier 15a, and a column switch circuit 16a.

The memory cell circuit 11a has a memory cell that forms one column of the memory cell array 11 of FIG. 1. FIG. 5 further shows cell plates 50, NMOS transistors 51 and 54, and capacitors 52 and 55. The NMOS transistor 51 has a source, a drain, and a gate, and they are respectively connected to one of two bit lines in a pair, to a cell plate 50 through the capacitor 52, and to a word line through which $V_{WORD}$ is applied. The NMOS transistor 54 has a source, a drain, and a gate, and they are respectively connected to the other bit line, to a cell plate 50 through the capacitor 55, and to another word line through which $V_{WORD}$ is applied. The capacitors 52 and 55 form memory cells capable of storing 1-bit data in the form of the presence or absence of electric charge. If the row decoder 12 applies $V_{WORD}$ to the gate of the NMOS transistor 51, this causes a memory cell formed by the capacitor 52 to be selected. On the other hand, if the row decoder 12 applies $V_{WORD}$ to the gate of the NMOS transistor 54, this causes a memory cell formed by the capacitor 55 to be selected.

The CMOS sense amplifier 15a forms a part of the sense amplifier row 15 and is connected to the two bit lines of the memory cell circuit 11a. The CMOS sense amplifier 15a has two cross-coupled PMOS transistors 61 and 62 forming a PMOS sense amplifier and two cross-coupled NMOS transistors (not shown) forming an NMOS sense amplifier. The PMOS transistor 61 has a source, a drain, and a gate and they are respectively connected to a sense enable signal line SAP, to one of the bit lines on the NMOS transistor's 51 side, and to the other bit line on the NMOS transistor's 54 side. The PMOS transistor 62 has a source, a drain, and a gate and they are respectively connected to SAP, to the bit line on the NMOS transistor's 54 side, and to the bit line on the NMOS transistor's 51 side. The two cross-coupled PMOS transistors 61 and 62 together form a PMOS sense amplifier, and another two cross-coupled NMOS transistors (not shown) together form an NMOS sense amplifier.

The two bit lines of the memory cell circuit 11a are used as complementary signal lines. In other words, when a voltage of a high logic level is set to one of the two bit lines, a voltage of a low logic level is set to the other of the two bit lines. The CMOS sense amplifier 15a amplifies the voltages of the bit lines of the circuit 11a. As shown in FIG. 5, $V_W$ is applied from the row decoder 12 to SAP of the PMOS sense amplifier formed by the PMOS transistors 61 an 62, in order to determine a high-logic-level voltage held by one of the two bit lines at $V_W$ as soon as possible. On the other hand, in order to determine a low-logic-level voltage held by the other of the two bit lines at a $V_{SS}(=0\ V)$, $V_{SS}$ is mutually applied to drains of the not-shown NMOS transistors.

The column switch circuit 16a is a part of the column switch circuit row 16 of FIG. 1, being connected to both of the two bit lines of the memory cell circuit 11a. The column switch circuit 16a has two NMOS transistors 71 and 72. The NMOS transistor 71 has a source, a drain, and a gate, and they are respectively connected to one of two data lines in a pair, and to the bit line on the NMOS transistor's 51 side, and to a column line COL. The NMOS transistor 72 has a source, a drain, and a gate, and they are respectively connected to the other data line, and to the bit line as the NMOS transistor's 54 side, and to COL. $V_W$ is applied by the column decoder 13 to COL.

In a data write operation, whereas one of the two data lines of FIG. 5 receives $V_{PERI}(=V_{CC})$ from the peripheral circuit 20 as a voltage for data of a high logic level being written in a memory cell, the other data line receives 0V from the circuit 20 as a voltage used to write data of a low logic level in a memory cell. $V_{WORD}$ is applied to one word line from the row decoder 12. $V_W$ is applied to COL from the column decoder 13. $V_W$ is applied to SAP from the row decoder 12. At this point, both of the NMOS transistors 71 and 72 are conducting. As a result, the voltages on the data lines are transferred onto the bit lines. Such voltage changes taking place in the bit lines are amplified by the CMOS sense amplifier 15a so that the voltages of the two bit lines are determined in a short time. At this point in time, $V_W$ has been applied to SAP, as a result of which the voltage of one of the two bit lines is determined at $V_W$. The voltage of the other of the two bit line becomes LOW (=0 V). These bit line voltages are applied to the NMOS transistors' 51 and 54 sources. For example, suppose a memory cell formed by the capacitor 52 is selected, and the voltage setting of the data lines is carried out so that data of a high logic level is written in the memory cell in question. In this case, $V_W$ is applied to the source of the NMOS transistor 51 and $V_{WORD}$ that is greater than $V_W$ is applied to the gate of the NMOS transistor 51. As a result, the NMOS transistor 51 comes to a complete conduction and the capacitor 52 holds $V_W$ as a voltage for data of a high logic level.

In a data readout operation, one word line of FIG. 5 receives $V_{WORD}$, and COL and SAP each receive $V_W$. After the voltages of the bit lines are equalized by an equalizing circuit (not shown), a voltage held by, for example, the capacitor 52 within the memory cell circuit 11a is read out onto one bit line through the NMOS transistor 51 that is in a complete conducting state. According to the bit line voltage change, the CMOS sense amplifier 15a determines the voltages of the two bit lines. At this point, since $V_W$ has been applied to SAP, the voltage of one of the bit lines is determined by the CMOS sense amplifier 15a at $V_W$. Additionally, the voltage of the other of the bit lines becomes LOW (=0 V). These bit line voltages are read out onto the data lines through the NMOS transistors 71 and 72 within the column switch circuit 16a.

According to the present embodiment, $V_W$ acts as a HIGH data write voltage. In other words, if $V_{CC}$ is greater than $V_{OL}$, then $V_{CC}$ becomes a write voltage. As a result, unlike conventional techniques, the present invention does not suffer from the previously described problem of how to resist a high voltage when such is applied to a memory cell. If $V_{CC}$ is not greater than $V_{OL}$, $V_W$ is boosted and becomes a write voltage. Therefore, the data-holding time can be extended as necessity requires.

Conventionally, 5 V DRAMs of a single power source type and 3.3 V DRAMs of a single power source type have not been manufactured under the same product series. If $V_{REF}$ of the PSV control circuit 30 is set at 4.5 V, or $V_{OL}$, this makes it possible to cover these two different DRAMs under the same product series adopting the organization of FIG. 1.

Additionally, $V_{REF}$ to be compared by the control circuit 30 with $V_{CC}$ may be set above $V_{OL}$. Furthermore, even if the supply voltage to COL is set at $V_{PERI}$ (=$V_{CC}$), as in the peripheral circuit 20, $V_W$ still can act as a HIGH data write voltage, but the speed of read/write somewhat decreases as the ON impedance of the NMOS transistors 71 and 72 increases.

Embodiment 2

Figure 6:
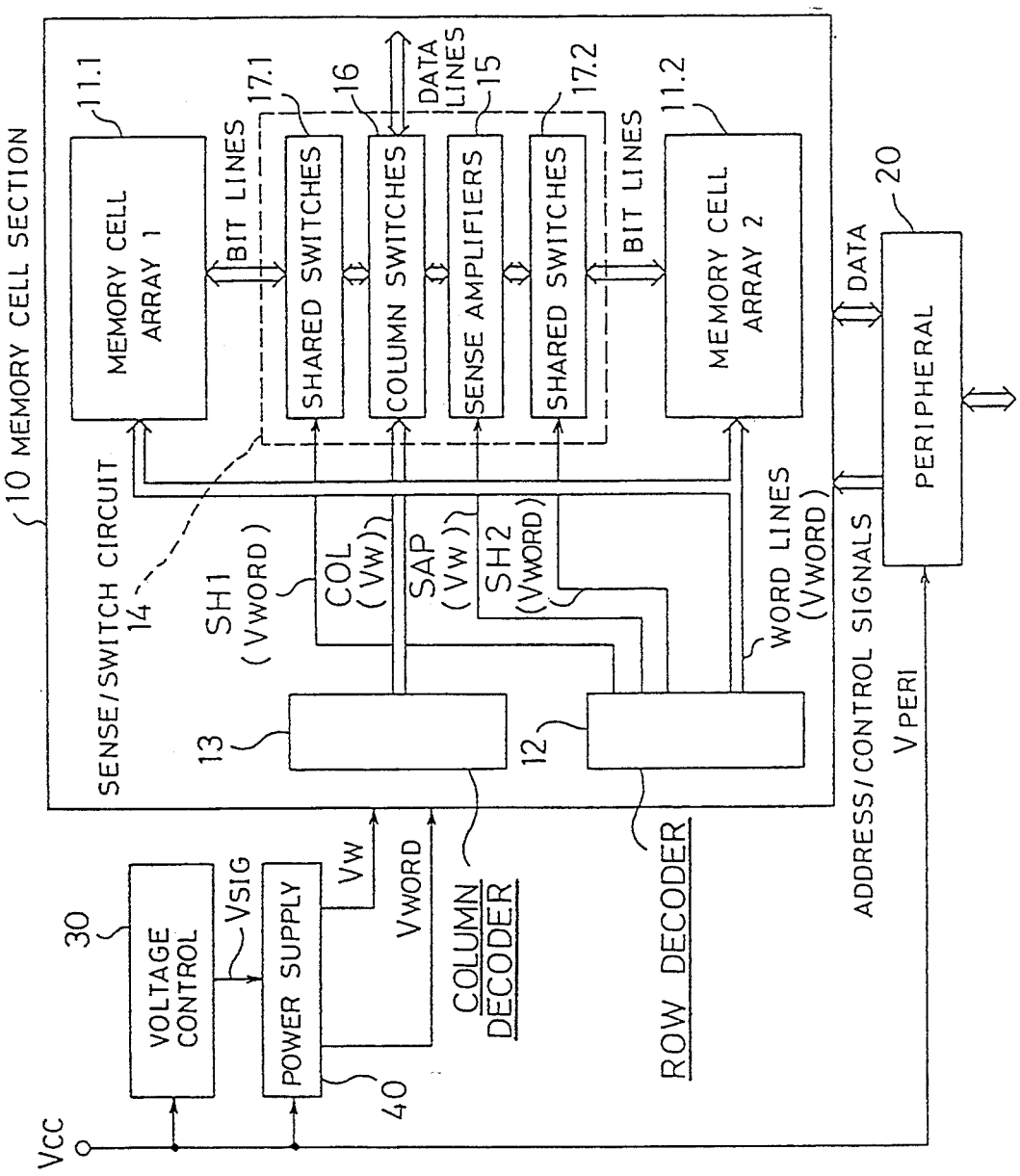
FIG. 6 is a block diagram showing a semiconductor memory of another preferred embodiment of the present invention.

FIG. 6 is a block diagram showing the organization of a DRAM according to a second preferred embodiment of the invention. The second embodiment is characterized in that the memory cell section 10 contains shared switch circuits. FIG. 6 shows a first memory cell array 11.1 and a second memory cell array 11.2. The sense/switch circuit row 14 has a first row of shared switch circuits 17.1 and a second row of shared switch circuits 17.2, in addition to the sense amplifier row 15 and the column switch circuit row 16.

The first shared switch circuit row 17.1 is used to establish connection between the first memory cell array 11.1 and a circuit block formed by the sense amplifier 15 and the column switch circuit row 16, whereas the second shared switch circuit row 17.2 is used to establish connection between the second memory cell array 11.2 and the aforesaid circuit block. The PSV control circuit 30 of the present embodiment is identical in configuration with the one shown in FIG. 2, and the power supply circuit 40 of the present invention is identical in configuration with the one shown in FIG. 3.

Figure 7:
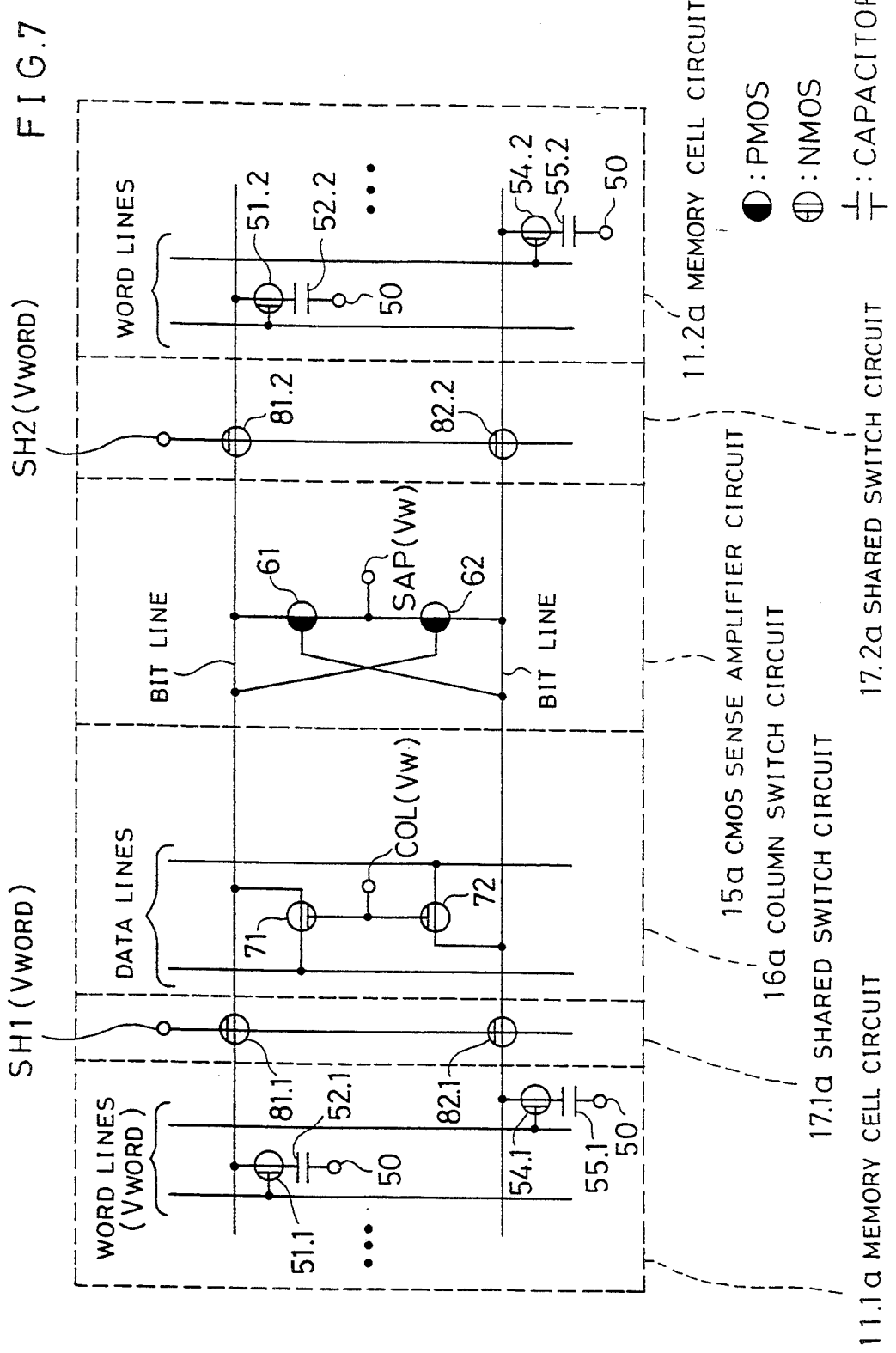
FIG. 7 is a circuit diagram showing in detail a memory cell section of FIG. 6.

The memory cell section 10 of FIG. 6 is partly detailed in FIG. 7. FIG. 7 shows a first memory cell circuit 11.1a, a second memory cell circuit 11.2a, a column switch circuit 16a, a first shared switch circuit 17.1a, and a second shared switch circuit 17.2a, in addition to the CMOS sense amplifier 15a, The first memory cell circuit 11.1a has a memory cell forming one column of the first memory cell array 11.1 of FIG. 6. In addition to the cell plates 50, FIG. 7 shows NMOS transistors 51.1 and 54.1 and capacitors 52.1 and 55.1, and these elements are interconnected in the same manner as in the first embodiment. $V_{WORD}$ is applied to a gate of the NMOS transistor 51.1 from the row decoder 12 through one word line. $V_{WORD}$ is also applied to a gate of the NMOS transistors 54.1 from the row decoder 12 through another word line.

The second memory cell circuit 11.2a has a memory cell forming one column of the second memory cell array 11.2 of FIG. 6. Respectively indicated by reference numerals 51.2, 54.2 and 52.2, 55.2 are NMOS transistors each used to store 1-bit data and capacitors. $V_{WORD}$ is applied to a gate of the NMOS transistor 51.2 from the row decoder 12 through one word line. $V_{WORD}$ is also applied to a gate of the NMOS transistor 54.2 from the row decoder 12 through another word line.

A CMOS sense amplifier and a column switch circuit used here are identical in organization with their counterparts of the first embodiment, and thus they are indicated by the same reference numerals (i.e., 15a and 16a). SAP receives $V_W$ from the row decoder 12, and COL receives $V_W$ from the column decoder 13.

The first shared switch circuit 17.1a is a part of the first shared switch circuit row 17.1 of FIG. 6. This circuit 17.1a has two NMOS transistors 81.1 and 82.1. The NMOS transistor 81.1 has a source connected to one of two bit lines (i.e. a pair of common bit lines) of the CMOS sense amplifier 15a and the column switch circuit 16a, a drain connected to one of two bit lines of the first memory cell circuit 11.1a, and a gate connected to a first shared switch signal line SH1. The NMOS transistor 82.1 has a source connected to the other of the common bit lines, a drain connected to the other bit line of the first memory cell circuit 11.1a, and a gate connected to SH1.

The second shared switch circuit 17.2a is a part of the second shared switch circuit row 17.2 of FIG. 6. This circuit 17.2a has two NMOS transistors 81.2 and 82.2. The NMOS transistor 81.2 is sandwiched between one of the common bit lines and one of two bit lines of the second memory cell circuit 11.2a. The NMOS transistor 82.2 is sandwiched between the other common bit line and the other bit line of the second memory cell circuit 11.2a. These two NMOS transistors 81.2 and 82.2 are connected, through their respective gates, to a second shared switch signal line SH2.

The row decoder 12 of the second embodiment supplies the word lines of FIG. 7 with $V_{WORD}$ and also supplies SAP with $V_W$. Further, the row decoder 12 supplies SH1 or SH2 with $V_{WORD}$ in a selective manner. In other words, the row decoder 12 applies $V_{WORD}$ to SH1 when access to the first memory cell circuit 11.1a is required, while $V_{WORD}$ is applied to SH2 when access to the second memory cell circuit 11.2a is required.

At the time when data is written in the first memory cell circuit 11.1a, $V_{WORD}$ is applied to SH1 and a voltage at low logic level (=0 V) is applied to SH2. The source voltage of one of the two NMOS transistors 81.1 and 82.1 is raised by the CMOS sense amplifier 15a up to $V_W$. $V_{WORD}$ ($>V_W$) is applied to the gates of these transistors 81.1 and 82.1 in order that they (transistors 81.1 and 82.1) come to a complete conduction. As a result, if data of a high logic level is written in the capacitor 52.1 that has been selected, then $V_W$ supplied from the CMOS sense amplifier 15a is stored as a voltage for data of a high logic level.

At the time when data is written into the second memory cell circuit 11.2a, $V_{WORD}$ is applied to SH2 and a voltage at low logic level (=0 V) is applied to SH1. The process of data write here is carried out in the same manner as in the data write operation to the first memory cell circuit 11.1a.

In a data readout operation to read data from the first memory cell circuit 11.1a, $V_{WORD}$ is applied to SH1 and a voltage at low logic level (=0 V) is applied to SH2. At this point, the bit lines of the first memory cell circuit 11.1a are connected to the common bit lines through the first shared switch circuit 17.1a, while the bit lines of the second memory cell circuit 11.2a are electrically disconnected by the second shared switch circuit 17.2a from the common bit lines. Therefore, if it is assumed that the total storage capacity of the first and second memory cell circuits 11.1a and 11.2a is equal to the storage capacity of the memory cell circuit 11a of the first embodiment, the second embodiment will cut the bit line capacitance in half compared with the first embodiment. Usually, the readout voltage of from memory cell to bit line varies with CS/CB where CS is the capacitor's capacitance and CB is the bit line capacitance. Therefore, the readout voltage to a bit line doubles if the bit line capacitance falls fifty percent. This improves the amplification accuracy and the amplification speed of the CMOS sense amplifier 15a, and reliable, high-speed read operation can be achieved.

In a readout operation to read data from the second memory cell circuit 11.2a, $V_{WORD}$ is applied to SH2 and a voltage at low logic level (=0 V) is applied to SH1. This electrically isolates the bit lines of the first memory cell circuit 11.1a from the common bit lines. The process of data readout here is carried out in the same manner as in the data readout operation from the first memory cell circuit 11.1a.

The second embodiment not only covers the advantages of the first embodiment but also provides the above described effects.

Other Preferred Embodiments

Figure 8:
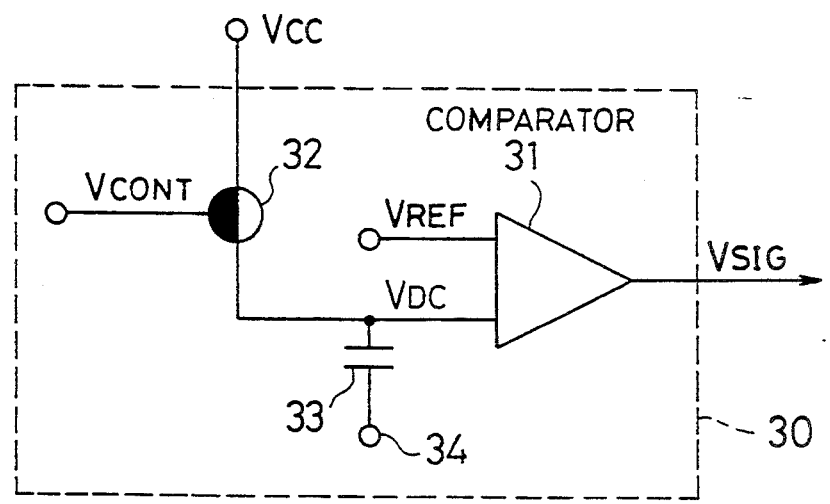
FIG. 8 is a circuit diagram showing a modification of the power supply voltage control circuit of FIG. 1 or FIG. 6.

FIG. 8 shows another organization of the PSV control circuit 30 of FIG. 1 or FIG. 6. FIG. 8 shows a comparator 31, a PMOS transistor 32, a dummy capacitor 33, and a cell plate 34. This comparator 31 compare a voltage of $V_{DC}$ held at the dummy capacitor 33 with $V_{REF}$. The comparator 31 outputs a signal of a high logic level if $V_{DC}<V_{REF}$ or a signal of a low logic level if $V_{DC}>V_{REF}$, as $V_{SIG}$. The dummy capacitor 33 corresponds to the capacitors 52 and 54 of FIG. 5 as well as to the capacitors 52.1, 52.2, 54.1, and 54.2 of FIG. 7. The dummy capacitor 33 is connected, at one of its terminals, to the cell plate 34. The same voltage as applied to the cell plate 50 is applied to the cell plate 34.

In the PSV control circuit 30 of FIG. 8, the application of a control signal $V_{CONT}$ to the PMOS transistor's 32 gate at the time of POWER-ON-RESET makes the PMOS transistor 32 conduct for a certain period of time. This allows the dummy capacitor 33 to store electric charge by a proportional amount to $V_{CC}$. Then, after an elapse of a predetermined period of time, $V_{DC}$ and $V_{REF}$ are compared by the comparator 31. The logic level of $V_{SIG}$ is determined according to the result of the comparison operation. After having determined the $V_{SIG}$ logic level at the time of POWER-ON-RESET in the above described sequence, the comparator 31 from then on holds the determined logic level. The power supply circuit 40 of FIG. 1 or FIG. 6 switches output voltage characteristics according to $V_{SIG}$ held at and delivered by the comparator 31.

The PSV control circuit 30 of FIG. 8 offers the advantage that advance evaluation of whether leakage of current is large or small (i.e., whether the data-holding time is long or short) can be made at the time of POWER-ON-RESET. This allows the output voltage characteristic of the power supply circuit 40 to be preset according to the evaluation result. The magnitude of $V_{CC}$ and the data hold characteristic can be evaluated totally.

In the present example, the PSV control circuit 30 of FIG. 8 is made to operate for once at the time of POWER-ON-RESET. This, however, is not to be considered restrictive. The circuit 30 may operate periodically. For example, the PMOS transistor 32 is made to conduct every time a row address strobe signal RAS is input, whereby the dummy capacitor 33 is charged, and each time the dummy capacitor 33 is charged, $V_{DC}$ is checked by the comparator 31.

Figure 9:
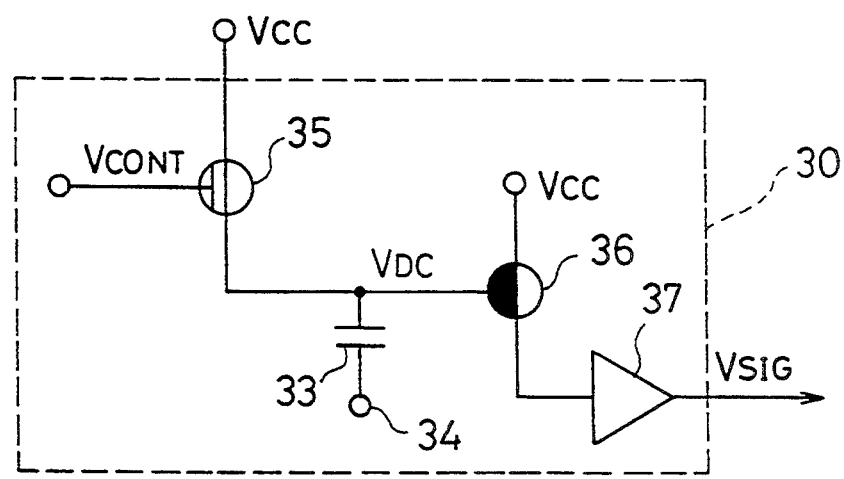
FIG. 9 is a circuit diagram showing still another modification of the power supply voltage control circuit of FIG. 1 or FIG. 6.

FIG. 9 shows still another organization of the PSV control circuit 30 of FIG. 1 or FIG. 6. As seen from FIG. 9, the PMOS transistor 32 of FIG. 8 is replaced by an NMOS transistor 35 and the comparator 31 of FIG. 8 is replaced by a PMOS transistor 36 and a buffer 37.

The PSV control circuit 30 of FIG. 9 is described. $V_{CONT}$ is applied to a gate of the NMOS transistor 35 at the time of POWER-ON-RESET, as a result of which the NMOS transistor 35 conducts just for a predetermined period of time. This allows the dummy capacitor 33 to store electric charge by a proportional amount to $V_{CC}$. $V_{DC}$, which is the gate voltage of the PMOS transistor 36, dissipates over a period of time because the dummy capacitor 33 leaks. When the gate-source voltage of the PMOS transistor 36 is held below its threshold voltage after an elapse of a predetermined period of time since the leakage current is small, the PMOS transistor 36 still remains in the OFF state. Therefore, the, buffer 37 sends out a signal of a low logic level as $V_{SIG}$. When the gate voltage of the PMOS transistor 36 considerably drops since the leakage current is great, this causes the PMOS transistor 36 to conduct, and the buffer 37 sends out a signal of a high logic level as $V_{SIG}$. After having determined the logic level of $V_{SIG}$ at the time of POWER-ON-RESET in the above described sequence, the buffer 37 from then on holds the determined logic level. The power supply circuit 40 of FIG. 1 or FIG. 6 switches output voltage characteristics according to $V_{SIG}$ held at and delivered by the buffer 37.

The PSV control circuit 30 of FIG. 9 offers the same effects as the one of FIG. 8, even with a smaller circuitry size.

In the present example, the PSV control circuit 30 of FIG. 8 is made to operate for once at the time of POWER-ON-RESET. This, however, is not to be considered restrictive. The PSV control circuit 30 may operate periodically. For example, the NMOS transistor 35 is made to conduct every time RAS is input, whereby the dummy capacitor 33 is charged, and each time the dummy capacitor 33 is charged, $V_{DC}$ is checked by the PMOS transistor 36 and by the buffer 37.

Figure 10:
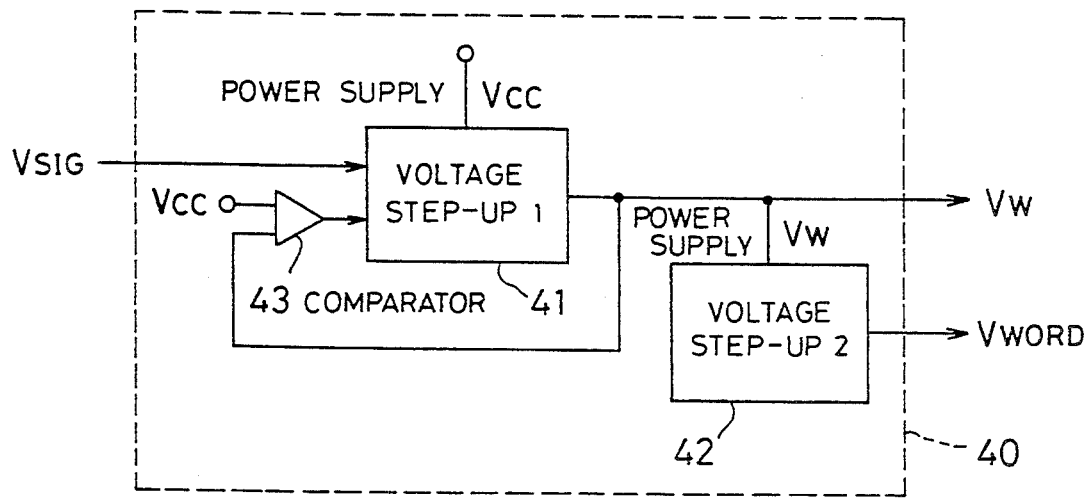
FIG. 10 is a block diagram showing a modification of the power supply circuit of FIG. 1 or FIG. 6.

FIG. 10 is a block diagram showing another organization of the power supply circuit 40 of the FIG. 1 or FIG. 6, which is similar to the one shown in FIG. 3 except for the provision of a comparator 43.

The voltage step-up circuit 41, used here, outputs a voltage that is equal to $V_{CC}$ as $V_W$ when the PSV control circuit 30 outputs $V_{SIG}$ of a low logic level, while a voltage as a result of boosting $V_{CC}$ is output from the circuit 41 as $V_W$ when the PSV 5 control circuit 30 outputs $V_{SIG}$ of a high logic level. The comparator 43 compares $V_{CC}$ with $V_W$ to deliver the comparison result to the first voltage step-up circuit 41 in order to hold the difference between $V_{CC}$ and $V_W$ below $V_T$. The second voltage step-up circuit 42 outputs a voltage as a result of further boosting $V_W$ from the circuit 41, as $V_{WORD}$.

Figure 11:
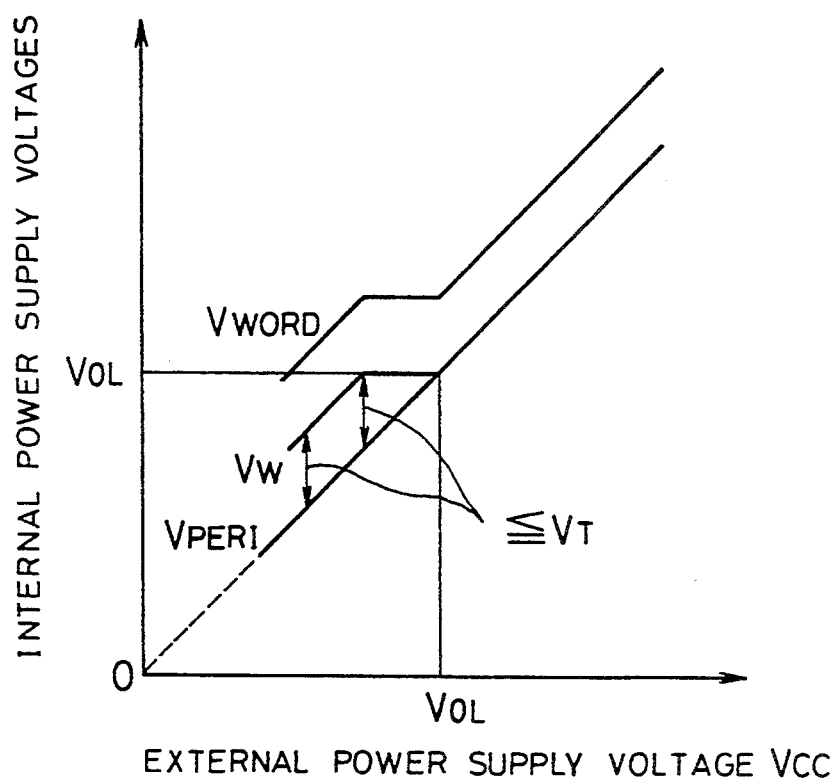
FIG. 11 shows an external power supply voltage-internal power supply voltage relationship, when the power supply circuit of FIG. 10 is used in the semiconductor memory of FIG. 1 or FIG. 6.

FIG. 11 shows a relationship between the internal power supply voltage ($V_{CC}$) and the external power supply voltage ($V_{PERI}$, $V_W$, $V_{WORD}$) for the power supply circuit 40 of FIG. 10. This graph shows characteristics when $V_{REF}$ (i.e., the reference voltage of the PSV control circuit 30) is set at $V_{0L}$.

As seen from FIG. 11, $V_{PERI}$ monotonically varies with $V_{CC}$ over the full range of $V_{CC}$. $V_W$ agrees with $V_{PERI}$ when $V_{CC}$ is greater than $V_{0L}$, whereas $V_W$ becomes a voltage ($<V_{0L}$) when $V_{CC}$ is not greater than $V_{0L}$. In addition, the difference between $V_W$ and $V_{PERI}$ ($=V_{CC}$) is always set below $V_T$. $V_{WORD}$ is greater than $V_W$ over the full range of $V_{CC}$, and the difference between $V_W$ and $V_{WORD}$ is set above $V_T$.

With the power supply circuit 40 of FIG. 10, even if $V_{CC}$ is lower than $V_{0L}$, the difference between $V_{PERI}$ ($=V_{CC}$) and $V_W$ is held below $V_T$. Therefore, as indicated in FIGS. 1 and 6, the memory cell section 10 and the peripheral circuit 20 can be interconnected directly without providing a level shift circuit between them.

Figure 12:
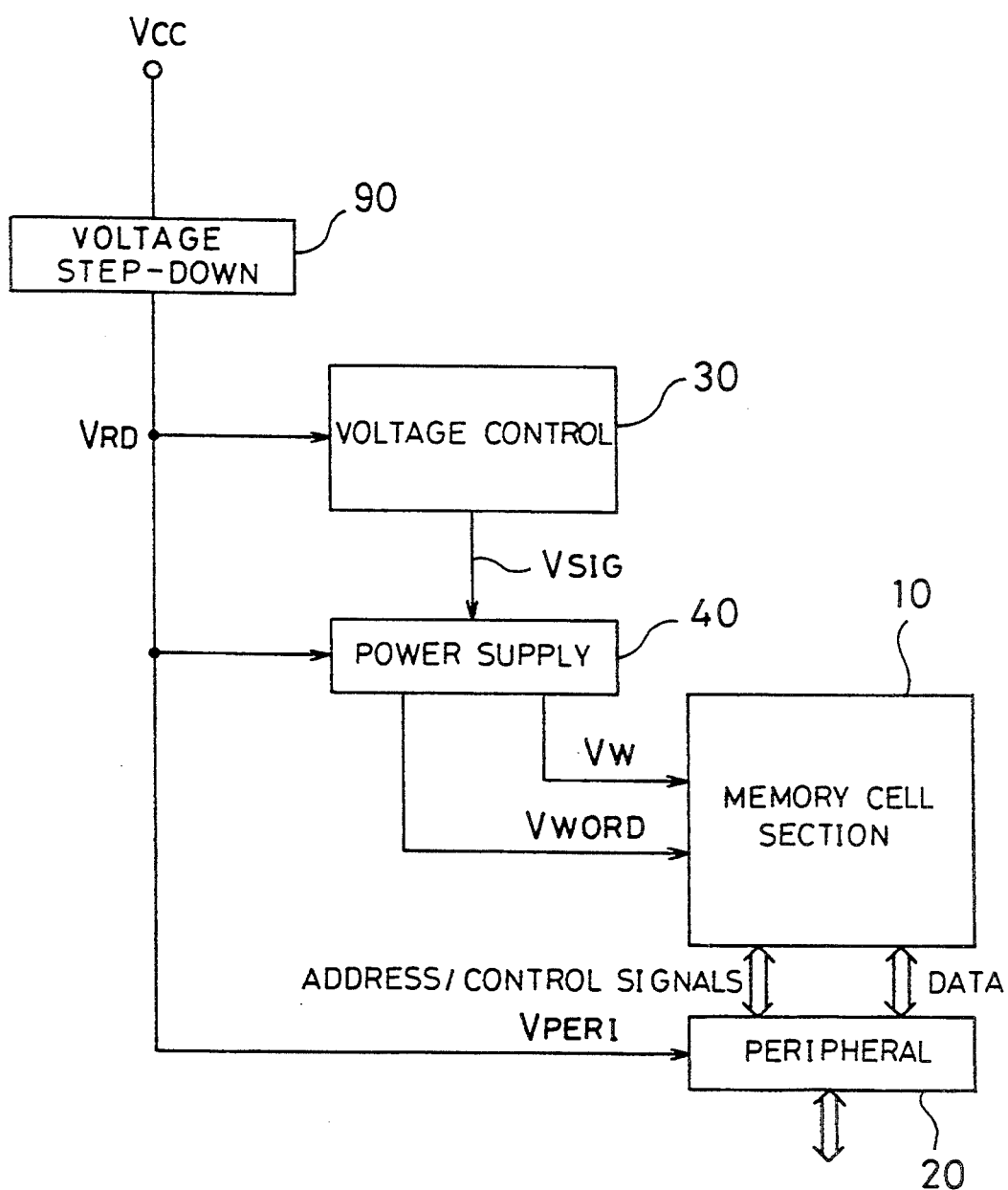
FIG. 12 is a block diagram showing a semiconductor memory of still another preferred embodiment of the present invention.

FIG. 12 is a block diagram showing one DRAM organization to be adopted when, in order to increase the reliability of internal components, a voltage obtained by reducing $V_{CC}$ is used as an internal power supply voltage. This organization is similar to the one of FIG. 1 or FIG. 6 except for the provision of a voltage step-down circuit 90.

The voltage step-down circuit 90 applies $V_{RD}$ (i.e. the voltage as a result of lowering $V_{CC}$) to the peripheral circuit 20 as $V_{PERI}$. Likewise, $V_{RD}$ is applied to the PSV control circuit 30 as well as to the power supply circuit 40. $V_{PERI}$ also in this case, monotonically varies with $V_{CC}$.

For example, in a 5 V DRAM of a single power source type ($V_{CC}$ recommended operating conditions: $V_0=5.0$ V; $V_{0H}=5.5$ V; and $V_{0L}=4.5$ V), $V_{CC}$ ($=5$ V) is reduced by the voltage step-down circuit 90 down to $V_{RD}$ ($=3.3$ V). In such a case, $V_{0L}$ of FIG. 4 or FIG. 11 is changed to 3.0 V.

When using the power supply voltage characteristic form of FIG. 4, $V_W$ agrees with $V_{PERI}$ if $V_{RD}$ is greater than 3.0 V, and if $V_{RD}$ is lower than 3.0 V, $V_W$ is held at a constant value of 3.0 V. When using the power supply voltage characteristic form of FIG. 11, $V_W$ agrees with $V_{PERI}$ if $V_{RD}$ is greater than 3.0 V. If $V_{RD}$ is not greater than 3.0 V, $V_W \leq 3.0$ V, and the difference between $V_{PERI}$ ($=V_{RD}$) and $V_W$ is restricted below $V_T$. In each form, $V_{PERI}$ monotonically varies with $V_{RD}$ over the full range of $V_{RD}$. Additionally, $V_{WORD}$ is greater than $V_W$ over the full range of $V_{RD}$ and the difference between $V_W$ and $V_{WORD}$ is set below $V_T$.

In a DRAM according to the organization of FIG. 12 capable of internally lowering $V_{CC}$, the data-holding time can be extended as necessity requires, as in the first and second embodiments.

In each of the above-described preferred embodiments, the PSV control circuit 30 mounded on a DRAM generates $V_{SIG}$ to the power supply circuit 40 according to $V_{CC}$. The logical level of $V_{SIG}$ may be fixed by, for example, a fuse ROM means when shipped from the factory, in which case the provision of the PSV control circuit 30 on DRAMs becomes unnecessary.

The invention claimed is:

1. A semiconductor memory of an electric charge storage type comprising:

a power supply circuit which receives a first internal power supply voltage (IPSV) which varies with an external power supply voltage (EPSV), wherein said power supply circuit outputs a second IPSV and a third IPSV, said second IPSV being set equal to said first IPSV if said first IPSV is greater than a predetermined voltage or being set above said first IPSV if said first IPSV is not greater than said predetermined voltage, and said third IPSV being set above said second IPSV, a memory cell circuit which has a capacitor for holding electric charges and a MOS transistor which has a source connected to a bit line, a drain connected to said capacitor, and a gate connected to a word line, a sense amplifier which has a MOS transistor which has a source connected to a sense enable signal line, a drain connected to said bit line, and a gate to which a signal for making the MOS transistor of said sense amplifier conduct is applied, and a row decoder which applies said second IPSV and said third IPSV onto said sense enable signal line and onto said word line, respectively.

2. The semiconductor memory as in claim 1, further including:

a column switch circuit which has a MOS transistor which has a source connected to a data line, a drain connected to said bit line, and a gate connected to a column line, and a column decoder which applies said second IPSV from said power supply circuit to said column line.

3. A semiconductor memory of an electric charge storage type comprising:

a power supply circuit which receives a first internal power supply voltage (IPSV) which varies with an external power supply voltage (EPSV), wherein said power supply circuit outputs a second IPSV and a third IPSV, said second IPSV being set equal to said first IPSV if said first IPSV is greater than a predetermined voltage or being set above said first IPSV if said first IPSV is not greater than said predetermined voltage, and said third IPSV being set above said second IPSV, a first memory cell circuit which has a first capacitor for holding electric charges and a MOS transistor which has a source connected to a first bit line, a drain connected to said first capacitor, and a gate connected to a word line, a first shared switch circuit which has a MOS transistor which has a source connected to a common bit line, a drain connected to said first bit line, and a gate connected to a first shared switch signal line, a second memory cell circuit which has a second capacitor for holding electric charges and a MOS transistor which has a source connected to a second bit line, a drain connected to said second capacitor, and a gate connected to said word line, a second shared switch circuit which has a MOS transistor which has a source connected to said common bit line, a drain connected to said second bit line, and a gate connected to a second shared switch signal line, a sense amplifier which has a MOS transistor which has a source connected to a sense enable signal line, a drain connected to said common bit line, and a gate to which a signal for making the MOS transistor of said sense amplifier conduct is applied, and a row decoder which applies said second IPSV to said sense enable signal line, applies said third IPSV to said word line, and applies said third IPSV to one or the other of said two shared switch signal lines that has been selected.

4. The semiconductor memory as in claim 3, further including:

a column switch circuit which has a MOS transistor which has a source connected to a data line, a drain connected to said common bit line, and a gate connected to a column line, and a column decoder which applies said second IPSV to said column line.

5. The semiconductor memory as in either claim 1 or claim 3, wherein said EPSV as supplied is applied to said power supply circuit as said first IPSV.

6. The semiconductor memory as in claim 5, wherein said predetermined voltage is a low limit voltage in a voltage range specified by recommended operating conditions of said EPSV.

7. The semiconductor memory as in either claim 1 or claim 3, further including a voltage step-down circuit which receives said EPSV wherein said received EPSV is reduced in voltage and applied to said power supply circuit as said first IPSV.

8. The semiconductor memory as in claim 7, wherein said predetermined voltage is a voltage corresponding to a low limit voltage in a voltage range of recommended operating conditions of to said EPSV.

9. The semiconductor memory as in either claim 1 or claim 3, wherein said power supply circuit includes:

a first voltage step-up circuit for generating said second IPSV from said first IPSV received, and a second voltage step-up circuit for generating said third IPSV from said second IPSV generated by said first voltage step-up circuit.

10. The semiconductor memory as in claim 9, wherein said power supply circuit further includes a comparator which compares said first IPSV with said second IPSV to send a result of the comparison operation to said first voltage step-up circuit so as to hold the difference between said first IPSV and said second IPSV below a threshold voltage of one MOS transistor.

11. The semiconductor memory as in either claim 1 or claim 3, wherein the difference between said second IPSV and said third IPSV is greater than a threshold voltage of one MOS transistor.

12. The semiconductor memory as in either claim 1 or claim 3, further including a power supply voltage control circuit which receives said first IPSV, wherein said power supply voltage control circuit sends out a voltage control signal to said power supply circuit so that the switching of the setting of said second IPSV in said power supply circuit is controlled according to the magnitude of said first IPSV.

13. The semiconductor memory as in claim 12, wherein said power supply voltage control circuit includes a comparator which makes a comparison between said first IPSV received and said predetermined voltage so as to send out a logic signal according to a result of the comparison operation as said voltage control signal.

14. The semiconductor memory as in claim 12, wherein said power supply voltage control circuit includes:
- a dummy capacitor for holding electric charges,
- a switch element, sandwiched between said dummy capacitor and a supply line for said first IPSV, for charging said dummy capacitor just for a certain period of time, and
- monitoring means for monitoring voltage changes in said dummy capacitor so as-to send out a logic signal according to a result of the monitoring operation as said voltage control signal.

15. A method of applying a write voltage to a memory cell in a semiconductor memory of an electric charge storage type, said method comprising:
- a step of checking whether an internal power supply voltage (IPSV) which varies with an external power supply voltage (EPSV) is greater than a predetermined voltage, and
- a step of selecting said IPSV if said IPSV is greater than said predetermined voltage or a voltage greater than said IPSV if said IPSV is not greater than said predetermined voltage, as a voltage for data of a high logic level being written in said memory cell.

16. A semiconductor memory of an electric charge storage type comprising:
- a power supply circuit which receives a first internal power supply voltage (IPSV) which varies with an external power supply voltage (EPSV), wherein said power supply circuit outputs a second IPSV and a third IPSV, said second IPSV being set equal to said first IPSV if said first IPSV is greater than a predetermined voltage or being set above said first IPSV if said first IPSV is not greater than said predetermined voltage, and said third IPSV being set above said second IPSV,
- a power supply voltage control circuit which receives said first IPSV, wherein said power supply voltage control circuit sends out a voltage control signal to said power supply circuit so that the switching of the setting of said second IPSV in said power supply circuit is controlled according to the magnitude of said first IPSV, said power supply voltage control circuit comprising:
  (a) a dummy capacitor for holding electric charges,
  (b) a switch element, sandwiched between said dummy capacitor and a supply line for said first IPSV, for charging said dummy capacitor for a certain period of time, and
  (c) monitoring means for monitoring voltage changes in said dummy capacitor so as to send out a logic signal according to a result of the monitoring operation as said voltage control signal,
- a memory cell circuit which has a capacitor for holding electric charges and a MOS transistor which has a source connected to a bit line, a drain connected to said capacitor, and a gate connected to a word line,
- a sense amplifier which has a MOS transistor which has a source connected to a sense enable signal line, a drain connected to said bit line, and a gate to which a signal for making the MOS transistor of said sense amplifier conduct is applied, and
- a row decoder which applies said second IPSV and said third IPSV onto said sense enable signal line and onto said word line, respectively.

17. A semiconductor memory of an electric charge storage type comprising:
- a power supply circuit which receives a first internal power supply voltage (IPSV) which varies with an external power supply voltage (EPSV), wherein said power supply circuit outputs a second IPSV and a third IPSV, said second IPSV being set equal to said first IPSV if said first IPSV is greater than a predetermined voltage or being set above said first IPSV if said first IPSV is not greater than said predetermined voltage, and said third IPSV being set above said second IPSV,
- a power supply voltage control circuit which receives said first IPSV, wherein said power supply voltage control circuit sends out a voltage control signal to said power supply circuit so that the switching of the setting of said second IPSV in said power supply circuit is controlled according to the magnitude of said first IPSV, said power supply voltage control circuit comprising:
  (a) a dummy capacitor for holding electric charges,
  (b) a switch element, sandwiched between said dummy capacitor and a supply line for said first IPSV, for charging said dummy capacitor for a certain period of time, and
  (c) monitoring means for monitoring voltage changes in said dummy capacitor so as to send out a logic signal according to a result of the monitoring operation as said voltage control signal,
- a first memory cell circuit which has a first capacitor for holding electric charges and a MOS transistor which has a source connected to a first bit line, a drain connected to said first capacitor, and a gate connected to a word line,
- a first shared switch circuit which has a MOS transistor which has a source connected to a common bit line, a drain connected to said first bit line, and a gate connected to a first shared switch signal line,
- a second memory cell circuit which has a second capacitor for holding electric charges and a MOS transistor which has a source connected to a second bit line, a drain connected to said second capacitor, and a gate connected to said word line,
- a second shared switch circuit which has a MOS transistor which has a source connected to said common bit line, a drain connected to said second bit line, and a gate connected to a second shared switch signal line,
- a sense amplifier which has a MOS transistor which has a source connected to a sense enable signal line, a drain connected to said common bit line, and a gate to which a signal for making the MOS transistor of said sense amplifier conduct is applied, and
- a row decoder which applies said second IPSV to said sense enable signal line, applies said third IPSV to said word line, and applies said third IPSV to one or the other of said two shared switch signal lines that has been selected.

* * * * *